(12) United States Patent
Kuo et al.

(10) Patent No.: US 6,448,101 B1
(45) Date of Patent: Sep. 10, 2002

(54) METHOD OF INTEGRATING A PHOTODIODE AND A CMOS TRANSISTOR WITH A NON-VOLATILE MEMORY

(75) Inventors: Tung-Cheng Kuo, I-Lan Hsien (TW); Chia-Hsing Chen, Hsin-Chu (TW); Samuel Cheng-Sheng Pan, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/683,382

(22) Filed: Dec. 20, 2001

(51) Int. Cl.⁷ ................. H01L 21/00; H01L 21/8247
(52) U.S. Cl. .................. 438/45; 438/211; 438/981; 438/258
(58) Field of Search ................. 438/211, 45, 257–267, 438/981

(56) References Cited

U.S. PATENT DOCUMENTS 6,251,719 B1 * 6/2001 Wang ..................... 438/238

\* cited by examiner

Primary Examiner—Richard Booth
(74) Attorney, Agent, or Firm—Winston Hsu

(57) ABSTRACT

A method of integrating a photodiode and a CMOS transistor with a NVM on a semiconductor substrate is provided. A photo sensor region, a periphery circuit region, and a memory cell region are defined on the substrate. A first doped area is formed within the semiconductor substrate in the periphery circuit region, the photo sensor region and the memory cell region. A second doped area is formed within the semiconductor substrate in the periphery circuit region. An ONO dielectric layer is formed on the surface of the semiconductor substrate. A third doped area is formed on the first doped area in the photo sensor region, and a fourth doped area is formed on the first doped area in the memory cell region. Following removal of portions of the ONO dielectric layer covering the fourth doped region in the photo sensor region, the periphery circuit region and the memory cell region, an oxide layer is formed on the first doped area, the second doped area, the third doped area, and the fourth doped area. A plurality of gates is formed in the periphery circuit region and in the memory cell region, and a source and a drain are formed in the periphery circuit region.

15 Claims, 11 Drawing Sheets

METHOD OF INTEGRATING A PHOTODIODE AND A CMOS TRANSISTOR WITH A NON-VOLATILE MEMORY

BACKGROUND OF INVENTION

1. Field of the Invention

The present invention relates to a method of integrating a photodiode and a complementary metal-oxide semiconductor (CMOS) transistor with a non-volatile memory (NVM) on a semiconductor substrate. According to the present invention, one can integrate these three elements by a simple process flow, in which the issue of an unstable threshold voltage of the NVM is improved and the sensitivity of the photodiode is enhanced.

2. Description of the Prior Art

A NVM is a common device for storing data in an integrated circuit, with one of its important characteristics being that the data stored in a NVM will not disappear after power is turned off. Accompanying the increase of the device's density in an integrated circuit, the variations of memory cells in a manufacturing process become more and more remarkable. For example, a memory cell of a flash memory encounters a problem in that sometimes a predetermined threshold voltage ($V_{th}$) of the memory cell can not be reached. When reading data in a memory cell by supplying a constant voltage, an unstable current is encountered. This affects the reliability of reading data.

SUMMARY OF INVENTION

It is therefore a primary objective of the claimed invention to provide a method of integrating a photodiode and a CMOS transistor with a NVM on a semiconductor substrate to provide a stable threshold voltage ($V_{th}$) for a NVM cell.

According to the claimed invention, the semiconductor substrate comprises a photo sensor region for forming a photodiode, a periphery circuit region for forming a CMOS transistor, and a memory cell region for forming a NVM cell. The method comprises the following steps:

(a) A first ion implantation process is performed to form a first doped area within the semiconductor substrate in the periphery circuit region, the photo sensor region and the memory cell region;

(b) Next, a second ion implantation process is performed to form a second doped area within the semiconductor substrate in the periphery circuit region;

(c) Then, a plurality of active areas are defined by forming a plurality of insulating layers on opposite sides of each active area;

(d) Following this, an oxide-nitride-oxide (ONO) dielectric layer is formed on the surface of the semiconductor substrate;

(e) And then, a third ion implantation process is performed to form a third doped area on the first doped area in the photo sensor region, and to form a fourth doped area on the first doped area in the memory cell region;

(f) After that, portions of the ONO dielectric layer is removed from the photo sensor region and the periphery circuit region, and portions of the ONO dielectric layer is removed from the surface of the fourth doped area in the memory cell region;

(g) A thermal oxidation process is performed to grow a protection oxide layer on the third doped area, a gate oxide layer on the first and the second doped areas in the periphery circuit region, and a field oxide layer on the fourth doped area; and (h) At last, a gate is formed on the gate oxide layer and on the field oxide layer in each active area, and a source and a drain are formed adjacent to the gate on both the first and second doped areas in the periphery circuit region.

A traditional oxide layer for implantation shielding is replaced by the ONO layer in the process of manufacturing the CMOS transistor and the photo sensor according to the present invention. Therefore, the CMOS transistor and the photo sensor can be integrated with the NVM without other additional processes. Moreover, the effect of channel hot electron (CHE) is applied to the present invention for programming data into the ONO layer, such that a stable threshold voltage can be reached.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
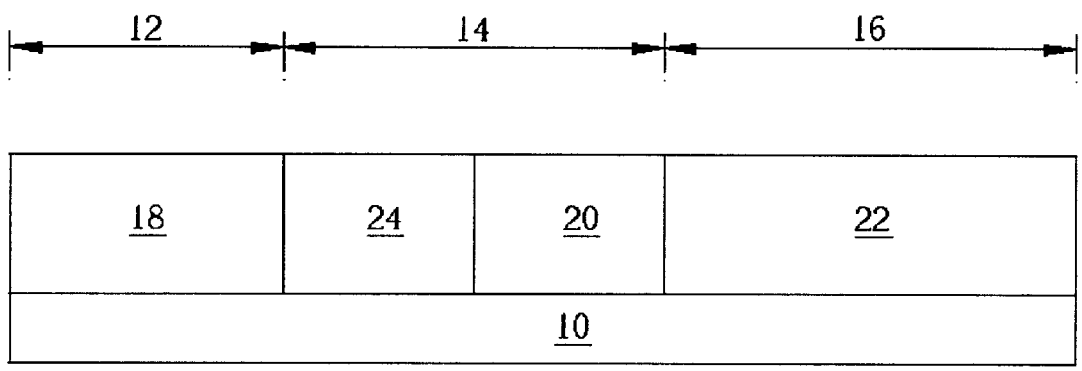
FIG. 1 is a schematic diagram of performing a first ion implantation process and a second ion implantation process on a semiconductor substrate.

Please refer to FIG. 1 to FIG. 11 of schematic diagrams of forming a photodiode, a CMOS transistor, and a flash memory cell on a semiconductor substrate according to the present invention. As shown in FIG. 1, a photo sensor region 12, a periphery circuit region 14, and a memory cell region 16 are defined on the semiconductor substrate 10.

A first ion implantation process is performed by doping P-type dopants, such as $BF_2^+$ ion or B (boron) atom, so as to form a P-well 18 on the surface of the semiconductor substrate 10 in the photo sensor region 12, a P-well 20 on the surface of the semiconductor substrate 10 in the periphery circuit region 14, and a P-well 22 on the surface of the semiconductor substrate 10 in the memory cell region 16.

Then, a second ion implantation process is performed by doping N-type dopants, such as As (arsenic) atom or P (phosphorous) atom, so as to form an N-well 24 on the surface of the semiconductor substrate 10 near the P-well 22 in the periphery circuit region 14.

Figure 2:
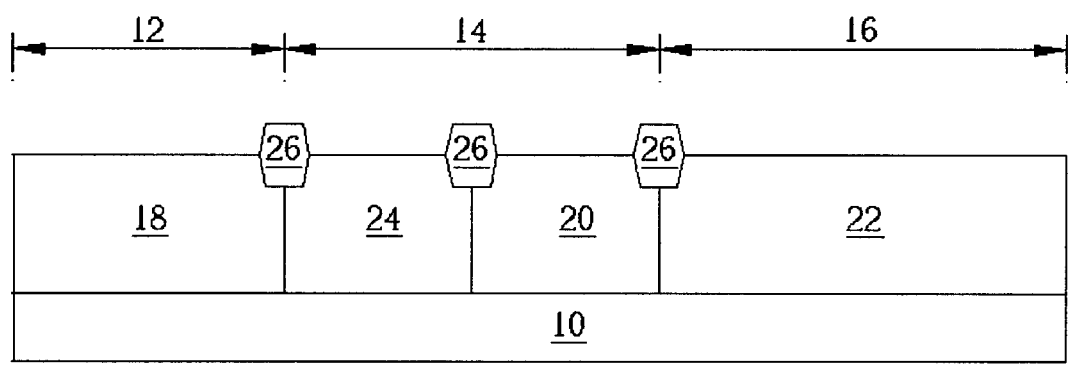
FIG. 2 is a schematic diagram of forming a plurality of insulating layers on the semiconductor substrate to define a plurality of active areas.

As shown in FIG. 2, an insulating process, such as shallow trench isolation (STI) or local oxidation of silicon (LOCOS), is used to form a plurality of insulating layers 26 on the surface of the semiconductor substrate 10 for defining a plurality of active areas (not shown).

Figure 3:
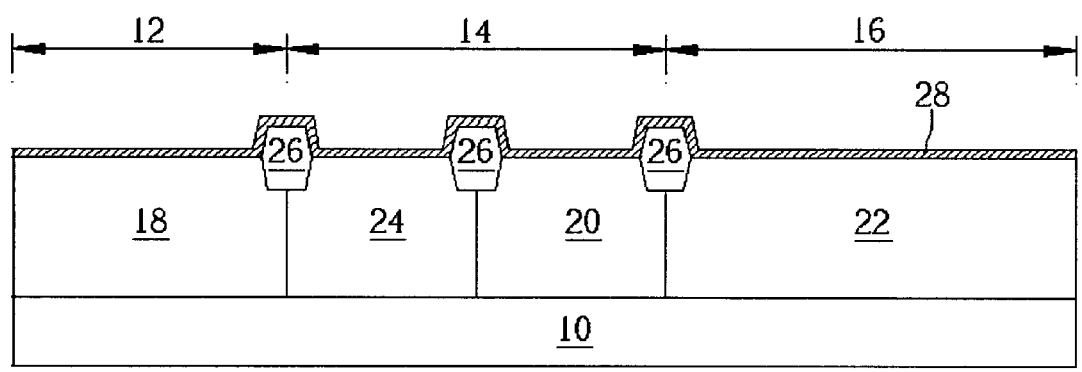
FIG. 3 is a schematic diagram of forming an ONO layer.

As shown in FIG. 3, an ONO process is performed to form an ONO dielectric layer 28 to uniformly cover the whole surface of the semiconductor substrate 10.

Figure 4:
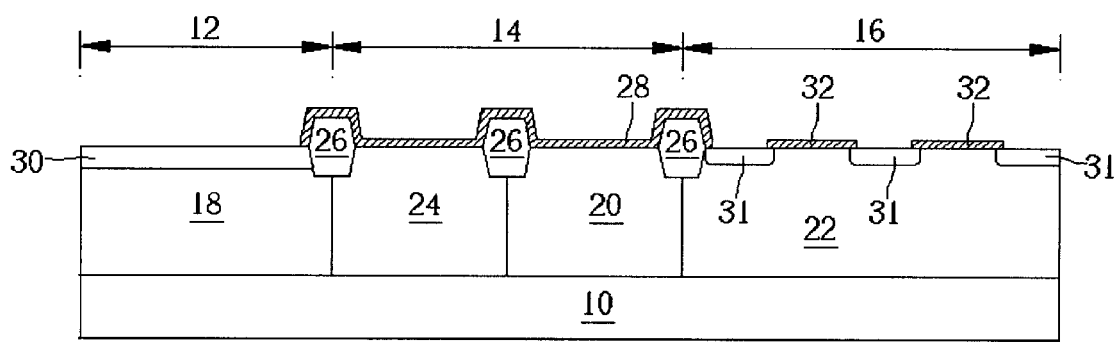
FIG. 4 is a schematic diagram of performing a third ion implantation process.

Then, as shown in FIG. 4, a third ion implantation process is performed using high dosage N-type dopants, such as As (arsenic) atom or P (phosphorous) atom. In this third ion implantation process, the ONO layer 28 is employed as a shielding layer for ion implantation, and a $N^+$ doped area 30 is formed on the surface of the p-well 18 in the photo sensor region 12 and a plurality of $N^+$ doped areas 31 is formed on the surface of the p-well 22 in the memory cell region 16. Wherein, a depletion region is formed across the PN junction between the $N^+$ doped areas 30 and the adjacent P-type well 18, and the depletion region is employed to induce the light current. The $N^+$ doped areas 31 are employed as buried bit lines of the flash memory cell.

Following this, an etching process is performed to remove portions of the ONO layer 28 that covers the surface of the $N^+$ doped areas 30 and 31. The remaining ONO layer 28 covering the periphery circuit region 14 is employed as a shielding layer, so as to protect the surface of the semiconductor substrate 10 in the periphery circuit region 14 during another ion implantation process for adjusting the dopant densities in the P-well 20 and the N-well 24. In addition, the remaining ONO layer 28 covering the surface of the P-well 22 in the memory cell region 16 will be employed as a floating gate 32 of the flash memory cell.

Figure 5:
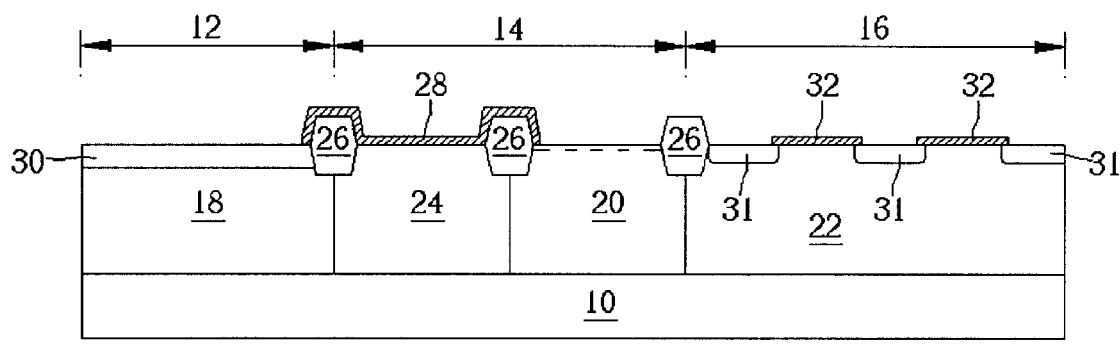
FIG. 5 is a schematic diagram of performing a fourth ion implantation process.
Figure 6:
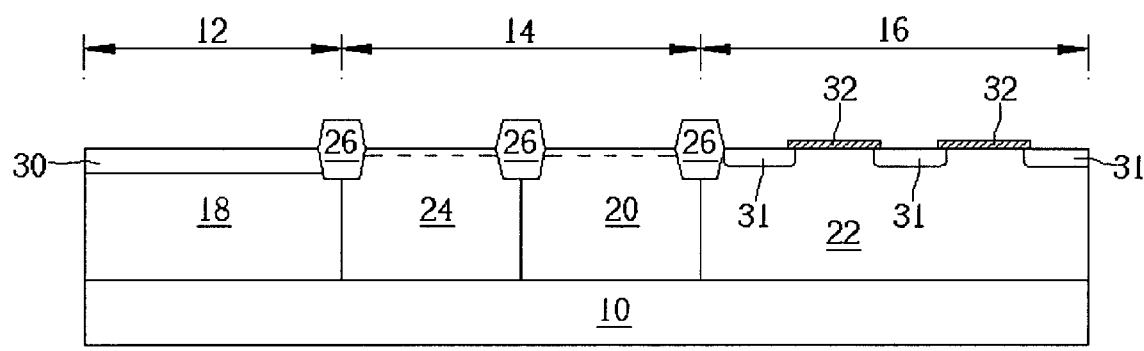
FIG. 6 is a schematic diagram of performing a fifth ion implantation process.

As shown in FIG. 5, a fourth ion implantation process and a fifth ion implantation process are performed, respectively, to adjust the dopant densities in the P-well 20 and N-well 24. The fourth ion implantation process uses a photoresist layer (not shown) and the ONO layer 28 as shielding layers, dopes N-type dopants on the surface of the P-well 20 to form a low resistance doped area (not shown), and then removes the ONO layer 28 from the surface of the P-well 20. As shown in FIG. 6, a photolithographic process and the fifth ion implantation process are performed to dope P-type dopants on the surface of the N-well 24, thus forming another low resistance doped area (not shown). Following that, the ONO layer 28 is removed from the surface of the N-well 24. However, in the other embodiments according to the present invention, the fourth and the fifth ion implantation processes are optional.

Figure 7:
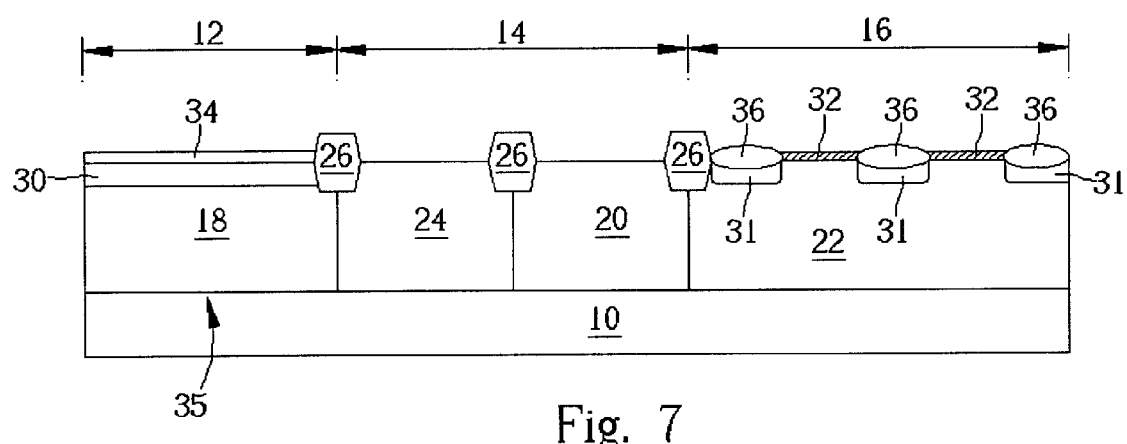
FIG. 7 is a schematic diagram of performing a thermal oxidation process.

As shown in FIG. 7, a thermal oxidation process is then performed for growing an oxide layer on the surface of the substrate 10. This oxide layer is employed as a protection oxide layer 34 on the surface of the $N^+$ doped area 30 so as to complete the photodiode 35. Moreover, this oxide layer is employed as a gate oxide layer (not shown) on the surface of the P-well 20 and N-well 24. Also, this oxide layer is employed as a field oxide layer 36 on the surface of the $N^+$ doped area 31. It is worthy of note that since the lattice structures on the surface of the P-well 20 and N-well 24 were damaged by the fourth ion implantation process and the fifth ion implantation process, the grown thickness of the gate oxide layer on the P-well 20 and N-well 24 is thinner than both the protection oxide layer 34 and the field oxide layer 36.

Figure 8:
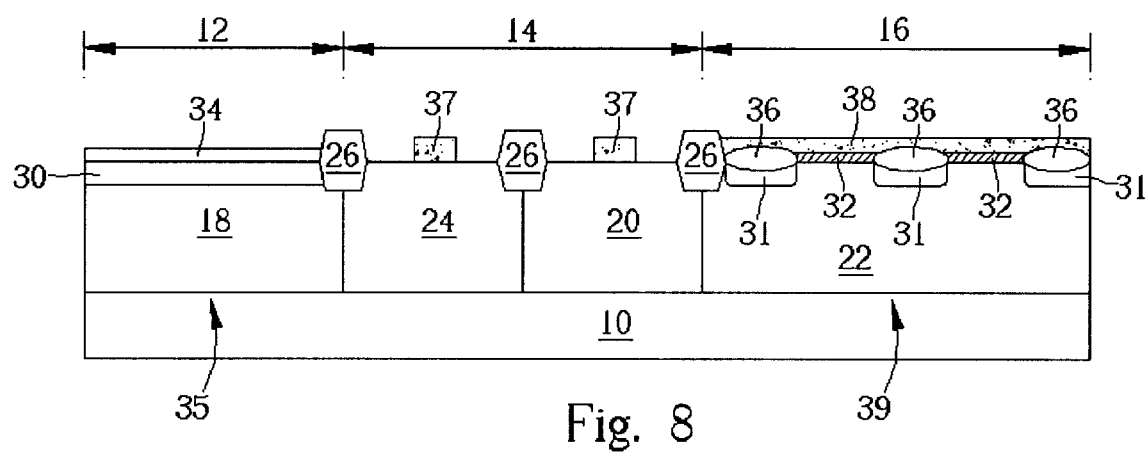
FIG. 8 is a schematic diagram of performing a CVD process for forming a polysilicon layer.

Then, as shown in FIG. 8, a chemical vapor deposition (CVD) process is performed to form a polysilicon layer to cover the whole surface of the substrate 10. Then, a photo-lithographic process and an etching process are performed to form a gate 37 on the gate oxide layer on the P-well 20 and N-well 24, and simultaneously form a word line, functioning as a control gate 38, above the P-well 22 to cover both of the field oxide layer 36 and the floating gate 32 to complete the flash memory cell 39.

Figure 9:
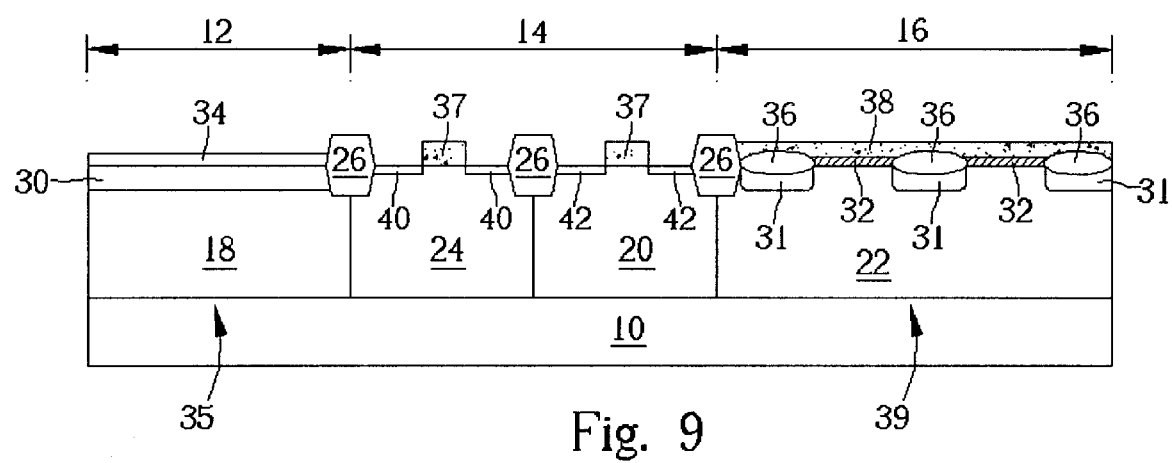
FIG. 9 is a schematic diagram of forming a source/drain extension in the peripheral circuit region.
Figure 10:
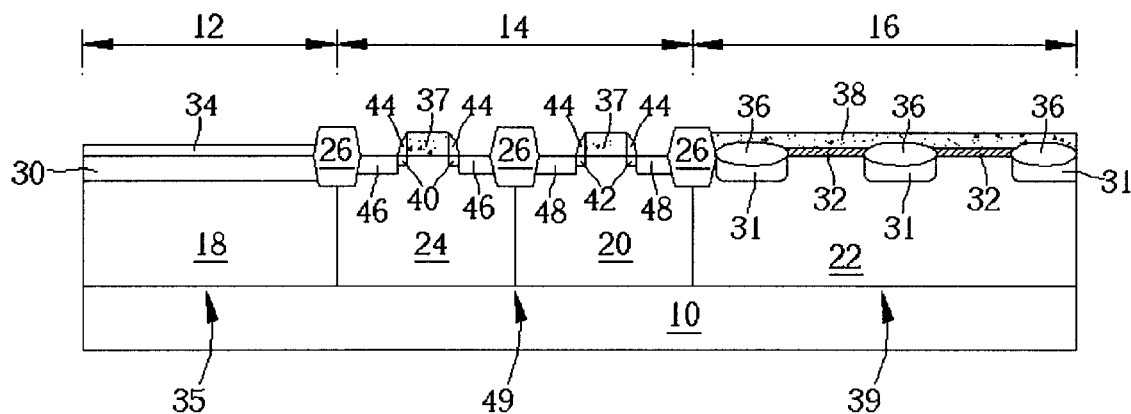
FIG. 10 is a schematic diagram of forming a source/drain in the peripheral circuit region.
Figure 11:
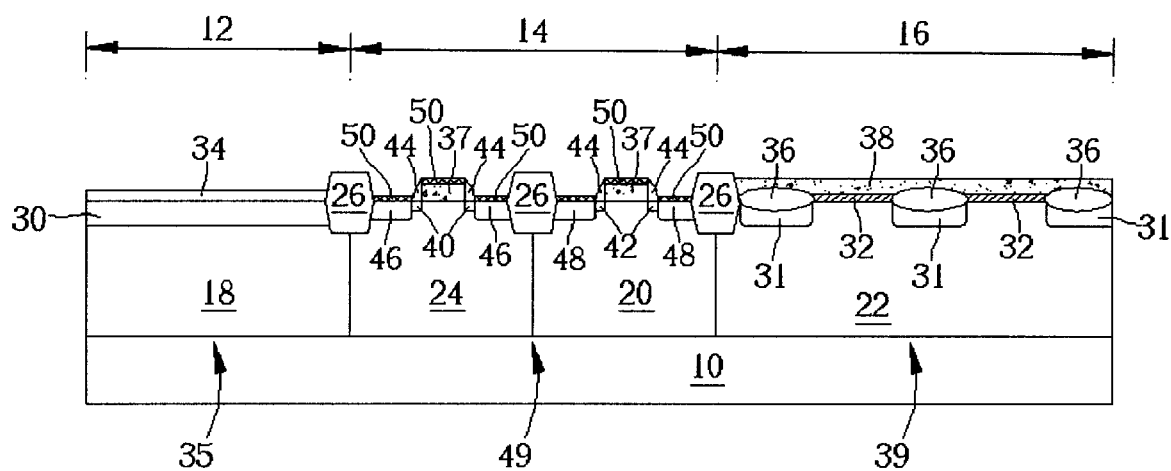
FIG. 11 is a schematic diagram of forming a salicide layer.

For completing the CMOS transistor 49, the following processes are performed. As shown in FIG. 9, a $P^-$ doped area 40 is formed beside the gate 37 on the N-well 24, and an $N^-$ doped area 42 is formed beside the gate 37 on the P-well 20, the $P^-$ doped area 40 and the $N^-$ doped area 42 functioning as a source/drain extension. As shown in FIG. 10, a spacer 44 is formed on the side walls of the gate 37. Then, a $P^+$ doped area 46 is formed on the N-well 24 and an $N^+$ doped area 48 is formed on the P-well 20, the $P^+$ doped area 46 and the $N^+$ doped area 48 functioning as a source/drain. As shown in FIG. 11, a self-aligned silicide (salicide) process is performed to form a salicide layer 50 on the gate 37, on the $P^+$ doped area 46, and on the $N^+$ doped area 48.

In general, the threshold voltage of the flash memory cell 39 is dependent on the dopant concentration in P-well 22. But, the dopant concentration is difficult to control since many implantation processes are performed to complete the flash memory cell. In addition, other variations in the manufacturing process and variations of the other elements may be produced. Thus, the threshold voltage of the flash memory cell 39 deviates from the standard value. To solve this problem, a CHE effect is applied after completing the above-mentioned processes for forming the flash memory cell 39. Utilizing the CHE effect, a high voltage is supplied on the control gate 38, so as to induce a lateral electric field to accelerate channel electrons between two $N^+$ doped areas 31 to program the floating gate 32. As a result, the threshold voltage for the flash memory cell 39 is adjusted to an ideal value.

Furthermore, the present invention uses the ONO dielectric layer 28 to replace the typical implantation shielding oxide layer in the processes for forming the CMOS transistor 49 and the photodiode 35. Therefore, the CMOS transistor 49 and the photodiode 35 can be easily integrated with the flash memory cell 39 without increasing any manufacturing process or cost. Moreover, the present invention uses the protection oxide layer 34 to protect the photodiode 35, thus preventing the salicide layer 50 from forming on the surface of the photodiode 35 to affect the light flux.

In contrast to the complicated prior art manufacturing a photodiode, a CMOS transistor, and a NVM independently, the present invention provides a simple process flow to integrate manufacturing processes for forming a CMOS transistor, a photodiode, and a flash memory cell. In addition, an unstable threshold voltage of the flash memory cell is improved and the sensitivity of the photodiode is enhanced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of integrating a photodiode and a complementary metal-oxide semiconductor (CMOS) transistor with a non-volatile memory (NVM) on a semiconductor substrate, the semiconductor substrate comprising a photo sensor region for forming the photodiode, a periphery circuit region for forming the CMOS transistor, and a memory cell region for forming the non-volatile memory cell, the method comprising:

performing a first ion implantation process to form a first doped area within the semiconductor substrate in the periphery circuit region, the photo sensor region and the memory cell region;

performing a second ion implantation process to form a second doped area within the semiconductor substrate in the periphery circuit region;

patterning a plurality of active areas on the surface of the semiconductor substrate and forming an insulating layer on opposite sides of each active area;

forming an oxide-nitride-oxide (ONO) dielectric layer on the surface of the semiconductor substrate;

performing a third ion implantation process to form a third doped area on the first doped area in the photo sensor region, and form a fourth doped area on the first doped area in the memory cell region;

removing the ONO dielectric layer in the photo sensor region and the periphery circuit region, and removing the ONO dielectric layer on the surface of the fourth doped area in the memory cell region;

performing a thermal oxidation process to grow a protection oxide layer on the third doped area, a gate oxide layer on the first and the second doped areas in the periphery circuit region, and a field oxide layer on the fourth doped area; forming a gate on the gate oxide layer and the field oxide layer in each active area; and forming a source and a drain adjacent to the gate in the periphery circuit.

2. The method of claim 1 wherein both the protection oxide layer and the field oxide layer are thicker than the gate oxide layer.

3. The method of claim 1 wherein the non-volatile memory is a nitride read only memory (NROM).

4. The method of claim 1 wherein the non-volatile memory is a flash memory.

5. The method of claim 1 wherein before removing the ONO dielectric layer in the periphery circuit region, the method further comprises a fifth and a sixth implantation process to adjust dopant concentrations of the first and the second doped areas in the periphery circuit region, respectively.

6. The method of claim 1 wherein after the removal of the ONO dielectric layer on the fourth doped area, a portion of the ONO layer remains on a surface adjacent to the fourth doped area in the memory cell region.

7. The method of claim 6 wherein the ONO dielectric layer remaining on the surface adjacent to the fourth doped area is used to form a floating gate.

8. The method of claim 7 wherein a channel hot electron (CHE) effect is used to program the floating gate and adjust a threshold voltage ($V_{th}$) of the non-volatile memory cell.

9. The method of claim 1 wherein the source and drain comprise a salicide layer.

10. The method of claim 1 wherein the first doped area functions as a P-well.

11. The method of claim 10 wherein the second doped area functions as an N-well.

12. The method of claim 10 wherein the third and the fourth doped areas function as $N^+$ doped areas.

13. The method of claim 1 wherein the insulating layer is formed by shallow trench isolation (STI).

14. The method of claim 1 wherein the insulating layer is formed by local oxidation of silicon (LOCOS).

15. The method of claim 1 wherein the CMOS transistor further comprises a source/drain extension.

* * * * *